United States Patent [19]

Weller et al.

[11] 4,196,388

[45] Apr. 1, 1980

[54] APPARATUS FOR MONITORING HIGH ALTERNATING VOLTAGES

[75] Inventors: Geoffrey C. Weller, Great Haywood; George W. Evans, Dawley, both of England

[73] Assignee: The General Electric Company Limited, London, England

[21] Appl. No.: 902,686

[22] Filed: May 4, 1978

[30] Foreign Application Priority Data

May 11, 1977 [GB] United Kingdom ............... 19766/77

[51] Int. Cl.² .......................... G01R 15/06; H04B 1/04
[52] U.S. Cl. .................................. 324/128; 324/126; 328/167; 361/110
[58] Field of Search ................. 324/128, 126; 328/167; 361/110; 307/237

[56] References Cited

U.S. PATENT DOCUMENTS

| 2,510,631 | 6/1950 | Harder | 361/110 |
| 3,562,675 | 2/1971 | Urell | 328/167 |
| 4,091,236 | 5/1978 | Chen | 328/167 |

FOREIGN PATENT DOCUMENTS 1311720 3/1973 United Kingdom ..................... 324/126

Primary Examiner—Rudolph V. Rolinec
Assistant Examiner—Ernest F. Karlsen
Attorney, Agent, or Firm—Kirschstein, Kirschstein, Ottinger & Cobrin

[57] ABSTRACT

A capacitor divider type high alternating voltage monitoring apparatus incorporating a filter with a switchable gain/frequency characteristic for removing the effect of d.c. voltage error arising from trapped charge on the capacitor divider.

7 Claims, 8 Drawing Figures

APPARATUS FOR MONITORING HIGH ALTERNATING VOLTAGES

This invention relates to apparatus for monitoring high alternating voltages.

The invention relates particularly to apparatus for monitoring high alternating voltages of the kind comprising a capacitor potential divider for connection across a voltage to be monitored, and a response means connected across a section of the divider. Such an apparatus is hereinafter referred to as apparatus of the kind specified.

Apparatus of the kind specified typically finds application for monitoring the voltage of alternating voltage power transmission lines, in which case the response means typically comprises a metering or protective circuit connected with the divider via a buffer amplifier. The capacitor potential divider may be a purpose-built capacitor divider or a natural divider in some item of primary equipment, or may be formed by a modified capacitor voltage transformer, such as is described in United Kingdom Pat. No. 1,311,720.

One problem which arises with apparatus of the kind specified is that when the voltage being monitored is temporarily interrupted and charges are trapped on the capacitors in the divider, the trapped charges on the various capacitors in the divider decay at different rates. As a result, if the voltage being monitored is restored before the charges have entirely decayed, a d.c. error voltage may appear at the input to the response means. This error voltage decays at a rate dependent on the leakage resistances of the capacitors and the input impedance of the response means, but where as is normally the case, these are all very high, the error voltage may last for an appreciable time.

It is an object of the present invention to provide an apparatus of the kind specified wherein this problem is overcome.

According to the present invention in an apparatus of the kind specified there is provided, between said section of the divider and the response means, filter means which has a first mode in which it exhibits a relatively wide band pass characteristic and a second mode in which it exhibits a relatively narrow band pass characteristic and which can be changed from its second to its first mode with a given d.c. voltage at its input without producing an appreciable change in d.c. voltage at its output, and control means is provided for causing said filter means to operate temporarily in its second mode to reduce the effect on said response means of a voltage step across said section of the divider.

Said filter means suitably comprises a first section which defines said narrow band pass characteristic and a second section having a low pass characteristic whose cut-off frequency is changeable between a first and second values one below the lower cut-off frequency of said first section and the other above the upper cut-off of said first section, the first and second sections being connected so that the output of the filter is the input of the filter less those components of the input of the filter which are not passable by the first section and are passable by the second section so that when the cut-off frequency of the second section has its higher value the filter has a pass band the same as the pass band of said first section, and when the cut-off frequency has its lower value the filter has a wider pass band whose lower cut-off frequency is the cut-off frequency of said second section.

In a preferred arrangement in accordance with the invention said control means initiates operation of said filter means in its second mode in response to the detection of trapped charge on said section of the divider, and maintains said filter means in its second mode until either, with the voltage being monitored present there is no significant component at the output of the filter due to said trapped charge, or said trapped charge has substantially leaked away.

One high alternating voltage monitoring apparatus in accordance with the invention will now be described, by way of example, with reference to the accompanying drawings in which.

Figure 1:
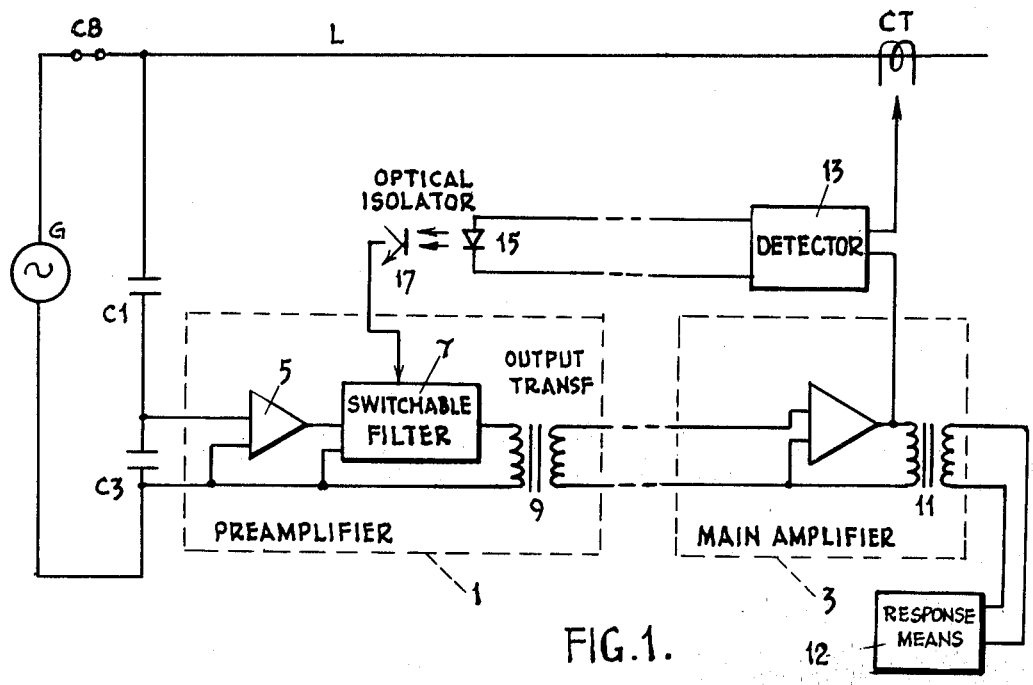
FIG. 1 is a block schematic diagram of the apparatus.

Referring to FIG. 1, the apparatus includes a capacitor divider comprising a number of capacitors connected in series across the voltage to be monitored. The output of the divider is derived from across an end section of the divider represented by a single capacitor C3 in FIG. 1, the remaining capacitance in the divider being represented by a single capacitor C1.

In FIG. 1 the divider C1, C3 is shown connected to a transmission line L supplied from a high voltage a.c. generator G, the transmission line including a circuit breaker CB between the generator and the divider.

The voltage appearing across the capacitor C3 is applied via a preamplifier 1 and a main amplifier 3 to a response means 12 such as a metering or protective circuit, the preamplifier presenting a very high impedance to the capacitor C3 so that under normal operating conditions the voltage $V_{ac}(t)$ across the capacitor C3 is an accurate replica of the voltage on the transmission line.

When the circuit breaker CB opens charges $q_1$ and $q_3$ are trapped on capacitors C1 and C3 respectively. Due to the light loading on capacitor C3, charges $q_1$ and $q_3$ are substantially equal at the time of opening circuit breaker CB, but by the time circuit breaker CB recloses are likely, due to having decayed at different rates, to have become unequal so that at the instant of reclosure of circuit breaker CB a d.c. error spill voltage $V_{dc}$ appears across capacitor C3 which decays only slowly through the impedance presented by preamplifier 1. A d.c. error voltage component can also appear across the capacitor C3 due to discharge across the capacitor C1 as a result of pollution of insulators.

The preamplifier 1 comprises a buffer amplifier 5 to whose input is applied the voltage across the capacitor C3. The output of the buffer amplifier 5 is supplied via a switchable filter 7 and a transformer 9 to the input of the main amplifier 3 whose output is applied to the response means via a further transformer 11. The main amplifier is associated with a detector 13 which, as is further explained below, determines the appropriate moments for switching the filter 7 from one mode to the other. The output of the detector 13 is utilised to control the filter 7 via a conventional optical isolator arrangement incorporating a light-emitting diode 15 and a photo-transistor 17. The isolator thus provides galvanic isolation and, to give further immunity from interference pick-up, the leads between the optical isolator and detector 13 and between the main amplifier 3 and preamplifier 1 are screened, twisted pairs of wires and carry balanced low impedance signals. The preamplifier 1 is located near the divider C1, C3 whilst the main amplifier 3 and detector 13 are located adjacent the response means.

Figure 2:
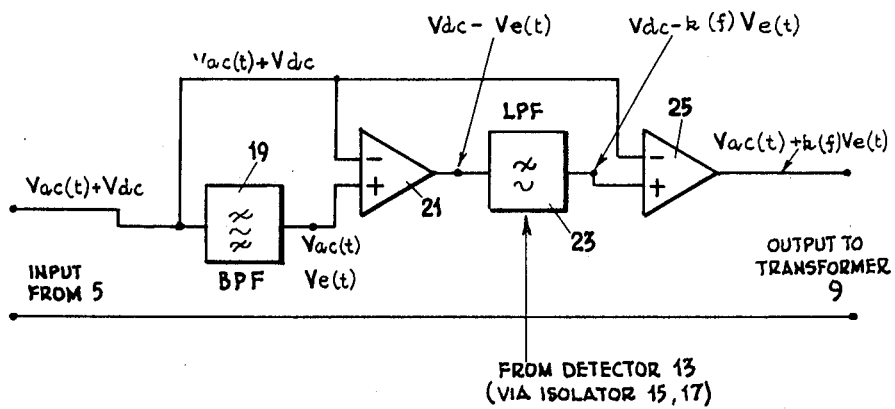
FIG. 2 is a block schematic diagram of a switchable filter incorporated in the apparatus of FIG. 1.

Referring now to FIG. 2, the filter 7 includes a first filter section 19 to which the output $V_{ac}(t)+V_{dc}$ (if present) of the buffer amplifier 5 is applied and which exhibits a fixed narrow band pass gain/frequency characteristic centred on the nominal frequency of the voltage on line L, the gain of the section 19 at the centre frequency being unity.

The output of the filter section 19 is thus $V_{ac}(t)+V_e(t)$ where $V_e(t)$ is an a.c. error signal caused by attenuation of high and low frequency components of $V_{ac}(t)$ by the filter section 19, and by any deviation of the frequency of the voltage on the line L from its nominal value.

The output of the filter section 19 and the output of the buffer amplifier 5 are applied to respective inputs of a differential amplifier 21 whose output is therefore $V_{dc}-V_e(t)$. This voltage is then fed to a section 23 of the filter 7 which exhibits a low pass gain/frequency characteristic so that its output is a voltage $V_{dc}-k(f)V_e(t)$ where $k(f)$ represents the gain/frequency characteristic of the section 23.

The output of the filter section 23 and the output of the buffer amplifier 5 are applied to the respective inputs of a second differential amplifier 25 whose output, which constitutes the output of the whole filter 7, is therefore $V_{ac}(t)+k(f)V_e(t)$.

If the cut-off frequency of filter section 23 is made high so that $k(f)$ is substantially equal to one, then the output of the filter 7 is $V_{ac}(t)+V_e(t)$, i.e. the same as the output of narrow band pass filter section 19.

If the cut-off frequency of filter section is very low so that $k(f)$ is substantially zero, then the output of the filter 7 is $V_{ac}(t)$, i.e. the filter as a whole exhibits a very wide band-pass characteristic with a very low cut-off frequency equal to the cut-off frequency of filter section 23.

The performance of the filter may be alternatively viewed as follows. With the arrangement shown in FIG. 2 the output of the filter 7 is the input of the filter 7 less those components of the input not passable by section 19 which are passable by section 23. Hence frequencies passable by section 19 are always present and only other frequencies passable by section 23 are absent in the overall filter output. Thus when the section 23 has a very high cut-off frequency the filter as a whole passes only frequencies within the pass band of section 19 and those beyond the cut-off frequency of section 23 which for practical purposes may be ignored, i.e. the filter 7 has a pass band the same as that of section 19. If the cut-off frequency of section 23 is made lower than the lower cut-off frequency of section 19, then the filter will exhibit a wide band pass characteristic (in theory a high pass characteristic) with lower cut-off at the cut-off frequency of section 23, i.e. a relatively wide pass band compared with that of section 19.

Thus the filter 7 can be changed from a narrow band width (NBW) mode to a wide band width mode (WBW) mode by reducing the cut-off frequency of the filter section 23, and vice versa. Furthermore, ignoring the possible presence of harmonics in the voltage $V_{ac}(t)$ and deviations of the voltage on line (L) from its nominal frequency so that $V_e(t)$ is zero, the output of filter section 23 is always exactly $V_{dc}$, whatever its cut-off frequency, so that changing the mode of filter 7 will not produce any change in d.c. voltage at the output of the filter 7.

To prevent the appearance of a d.c. error voltage $V_{dc}$ across the capacitor C3 appreciably affecting operation of the response means, e.g. on reclosure of circuit breaker CB as described above, the filter 7 is controlled by the detector 13 so as to be in its NBW mode from before the appearance of the error voltage $V_{dc}$ until a short period after its appearance sufficiently long for any transient at the output of the filter 7 resulting from the error voltage step to have substantially died away. The filter 7 is then operated into its WBW mode. It will be appreciated that return of the filter 7 to its WBW mode as soon as possible is desirable since in the NBW mode the filter frequency response is too narrow for the output of filter 7 to follow rapid or slow transients in the line voltage.

For a 50 Hz voltage on line L the filter 7 is suitably arranged to exhibit a frequency response characteristic with $-3$ db points at approximately 21 Hz and 79 Hz when in its NBW mode. A step voltage at the filter input will then only result in a filter output voltage transient having an amplitude of about 37% of the input step and decaying to about 1% of the input step in 20 milliseconds. The detector 13 is thus typically arranged to maintain the filter in its NBW mode for about 30 milliseconds after appearance of the error voltage $V_{dc}$. In the WBW mode the frequency response characteristic is determined by the apparatus as a whole rather than just the filter 7 and typically exhibits $-3$ db points at 0.27 Hz and 2 kHz.

It will be appreciated that in practice the voltage $V_{ac}(t)$ will contain harmonics and the voltage on the line L will deviate from its nominal frequency so that voltage $V_e(t)$ is not zero. As a result small transient offsets can occur at the filter output when switching the filter 7 from its NBW mode to its WBW mode and the value of $k(f)$ is altered. Such transients can be reduced by increasing the bandwidth of the filter 7 progressively, for example in steps, as further explained below when describing a practical embodiment of the filter 7. When the filter 7 is in its NBW mode any transient offset will decay very rapidly so that reducing the bandwidth of filter 7 in steps is not necessary.

Figure 3:
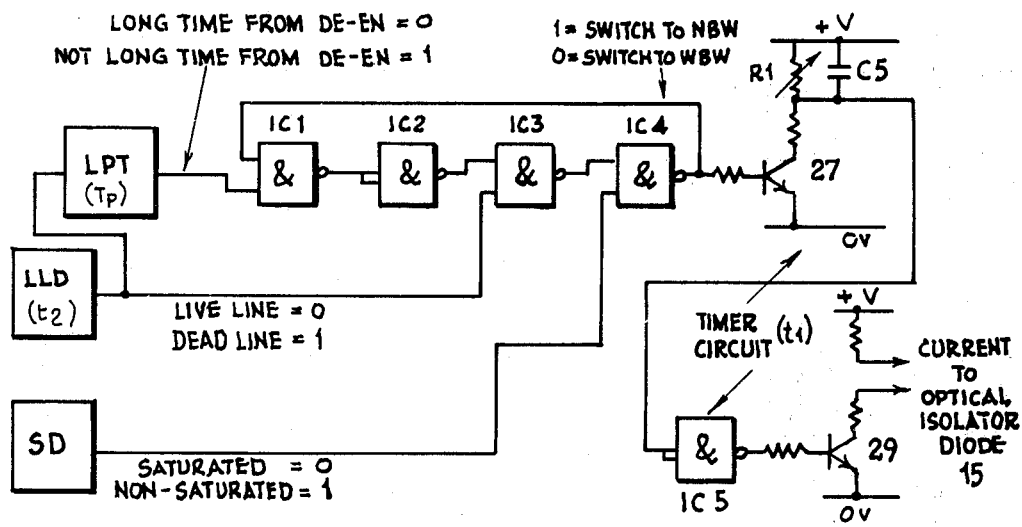
FIG. 3 is a block schematic diagram of a detector incorporated in the apparatus of FIG. 1.

Referring now to FIG. 3, the detector 13 incorporates a logic circuit which, in response to three inputs which indicate (1) whether the line L is live or dead; (2) whether a charge is trapped on the capacitor C3; and (3) whether a period $T_p$ has elapsed since the line L became dead, sends a signal to the filter 7 to cause it to operate in its NBW or WBW mode.

To this end the detector 13 incorporates a live line circuit LLD which produces a logic '0' signal when the line L is live, and a logic '1' signal when the line L is dead. As indicated in FIG. 1, the circuit LLD is typically supplied with an analogue of line voltage from the output of the main amplifier 3 and an analogue of line current via a current transformer CT forming part of the response means. The circuit LLD is typically arranged to produce an output '0' when the line voltage is above 80% of its nominal value or the line current is above 10% of its nominal full load value. The output of the circuit LLD is typically arranged to change from '1' to '0' within 3.5 to 13.5 milliseconds of the line L becoming live, depending on the point-on-wave of line energisation and the values of line voltage and current.

To detect trapped charge on the capacitor C3 the detector 13 includes a circuit SD which produces a logic '0' signal when the core of transformer 11 becomes magnetically saturated. Such saturation occurs when the filter 7 is in its WBW mode and there is a d.c. voltage across the capacitor C3, e.g. when circuit breaker CB opens so that a charge becomes trapped on capacitor C3 or when a pollution discharge occurs across capacitor C1.

A third circuit LPT produces a logic '1' output when a time $T_p$ has elapsed since the line L became dead, the circuit being reset to give an output '0' when the line becomes live, and starting a timing period each time the line becomes dead. These conditions are indicated to circuit LPT by circuit LLD. The time $T_p$ is the maximum possible time that any charges trapped on capacitors C1 and C3 take to decay to values low enough not to cause saturation of the core of transformer 11 with the filter 7 in its WBW mode. Typically $T_p$ is of the order 14 minutes.

The logic circuit of the detector 13 includes four two-input NAND gates IC1, IC2, IC3 and IC4.

The output of circuit LPT is applied to one input of gate IC1 whose output is applied to both inputs of gate IC2, which therefore operates as an inverter. The output of gate IC2 is applied to one input of gate IC3 whose other input is derived from circuit LLD. The output of gate IC3 is applied to one input of gate IC4 whose other input is derived from circuit SD. The output of gate IC4 is applied to the second input of gate IC1 and is connected via a transistor 27 and a further NAND gate IC5 operating as an inverter to a transistor 29 which controls the supply of current to the diode 15 of the optical isolator.

In operation of the logic circuit the output of gate IC4 is '1' only when either of its inputs is '0'. Thus the output of gate IC4 can become '1' only when the circuit SD detects saturation of transformer 11, and thereafter remains '1' only so long as line L remains dead and time $T_p$ has not elapsed since the line L became dead.

The transistor 27 is supplied with current via a resistor R1 in parallel with a capacitor C5 whose values are chosen in conjunction with the operating threshold voltage of gate IC5 so that the transistor 29 does not become nonconducting to cut-off the supply of current to diode 15 until a predetermined time t1 after the output of gate IC4 becomes '0', but conducts with zero delay when the output of gate IC4 becomes '1'.

The filter 7 is arranged to switch to its NBW mode when the diode 15 is supplied with current. Thus the filter 7 switches to its NBW mode whenever the circuit SD detects saturation of the transformer 11 to make the output of gate IC4 become '1'. The filter 7 then remains in its NBW mode until the output of gate IC4 becomes '0' and the supply of current to diode 15 is cut off i.e. until the line L becomes live or the time $T_p$ has elapsed, and the predetermined time t1 set by resistor R1, capacitor C5 and gate IC5 has elapsed. When the filter is switched to its WBW mode in response to the line L becoming live, the delay between the output of gate IC4 becoming '0' and the filter 7 changing mode is further increased by the operating time t2 of circuit LLD.

As stated above, the delay in switching of the filter 7 from NBW to WBW mode in response to the line L becoming live is typically required to be about 30 milliseconds. Thus the delay t1 set by resistor R1, capacitor C5 and gate IC5 is typically chosen to be 25 milliseconds, the circuit LLD providing a further average delay t2 of 5 milliseconds.

Considering the overall operation of the apparatus, whenever the circuit breaker CB opens at a point-on-wave such as to trap charge on the capacitors C1 and C3, as indicated by detection of the saturation of the core of transformer 11 by circuit SD, the filter 7 is operated into its NBW mode. The filter then remains in its NBW mode for a time long enough for the trapped charges to have decayed to values low enough not to cause saturation of transformer 11 with the filter 7 in its WBW mode, as indicated by the detection of elapse of time $T_p$ by circuit LPT, the filter returning to its WBW mode after a delay t1 after the circuit LPT indicates elapse of time $T_p$. If the circuit breaker CB closes before time $T_p$ has elapsed, the filter 7 remains in its NBW mode after the circuit breaker CB closes for a time t1+t2 long enough for any transient at the output of the filter 7 resulting from trapped charge to have substantially died away.

It will be appreciated that if, when the circuit breaker CB opens, insufficient charge to saturate transformer 11 is trapped, then the filter 7 will remain in its WBW mode and not switch to its NBW mode. This of course may occur; for example, if there is a load, transformer or earth fault on the line L, or the circuit breaker CB opens at or near a zero crossing point of the waveform of the voltage on line L.

When a pollution discharge occurs across capacitor C1, the filter 7 will immediately be operated into its NBW mode due to saturation of the core of transformer 11, the filter returning to its WBW mode after a delay t1 after the circuit SD ceases to indicate saturation.

It is pointed out in this connection that the circuit SD will cease to indicate saturation a short time after the filter 7 assumes its NBW mode.

Figure 6:
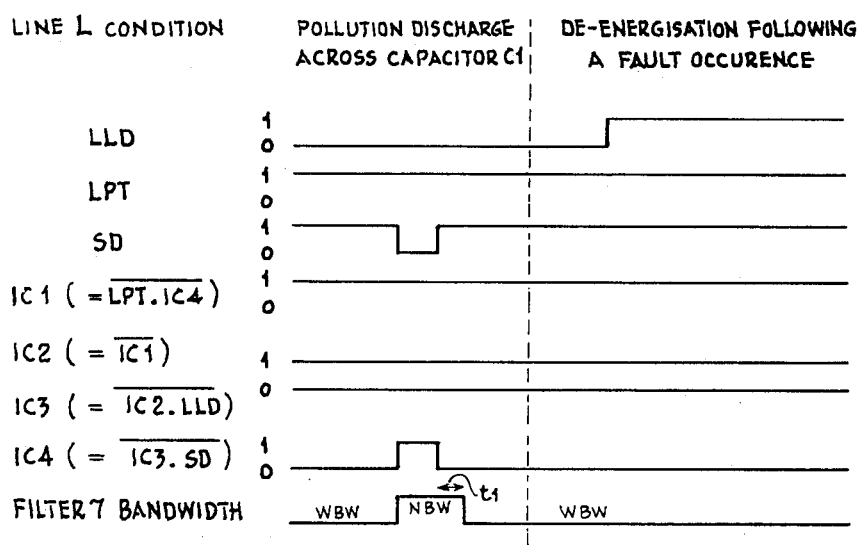
FIGS. 6a, 6b and 6c are diagrams illustrating the operation of the apparatus.
Figure 6A:
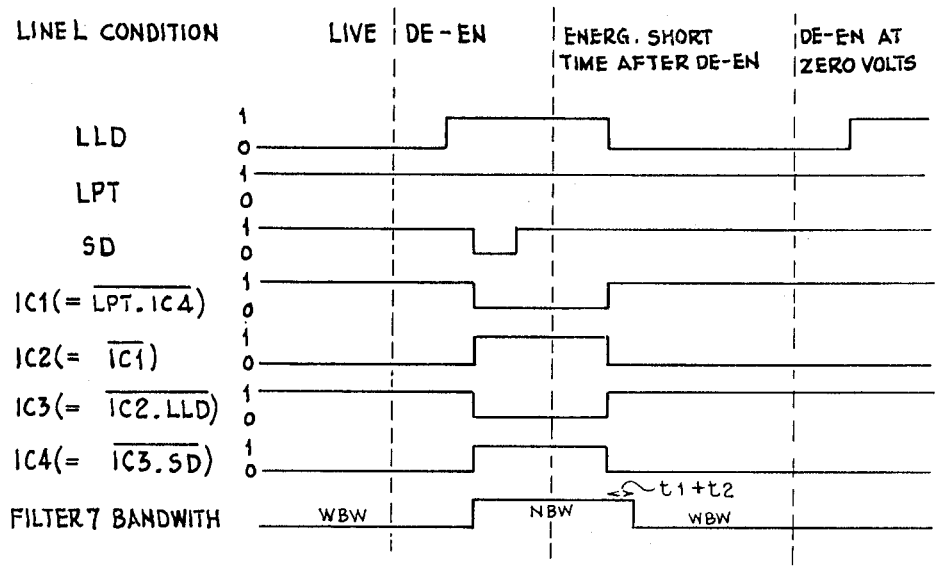
Figure 6B:
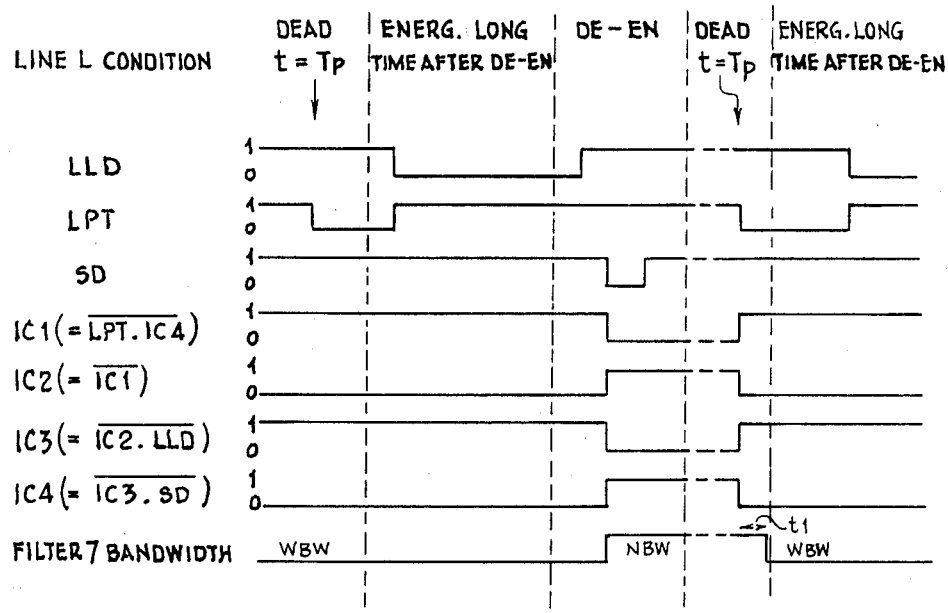

Changes in the output of the components of detector 13 and in the mode of filter 7 during some typical sequences of change in line condition are shown graphically in FIG. 6a, 6b and 6c which are self explanatory.

Figure 4:
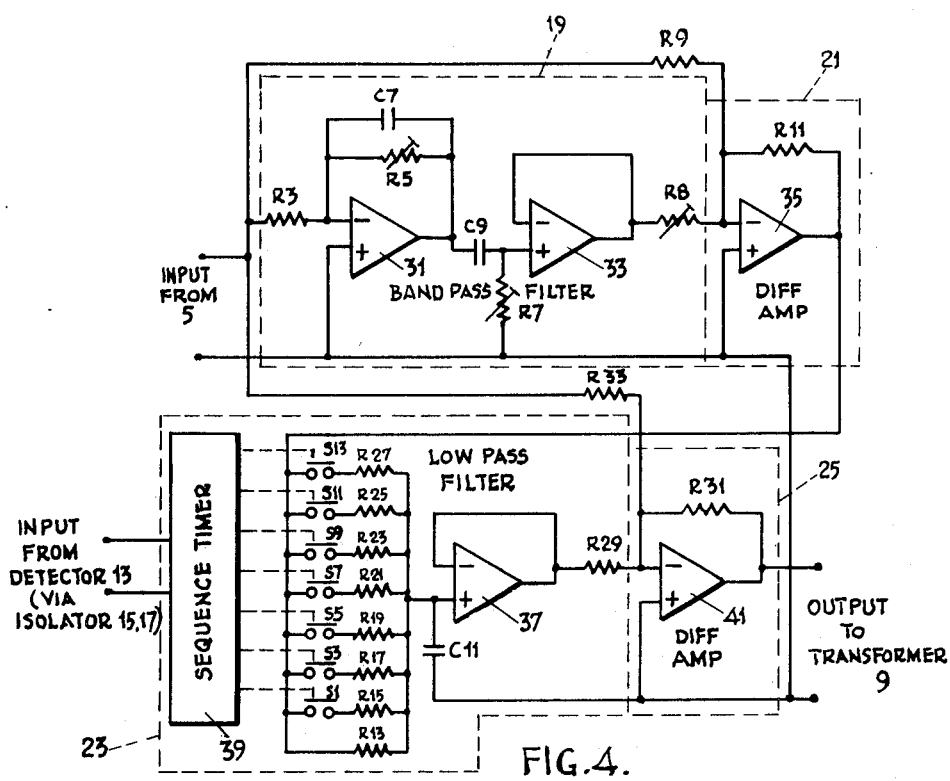
FIG. 4 is a circuit diagram of the filter of FIG. 2.

One practical embodiment of the filter 7 is shown in FIG. 4. In this embodiment the filter section 19 is constituted by two operational amplifiers 31 and 33 connected in a conventional band-pass filter arrangement incorporating resistors R3, R5, R7 and R8 and capacitors C7 and C9. The differential amplifier 21 is constituted by an operational amplifier 35 and a feedback resistor R11, and an input from buffer amplifier 5 is fed to amplifier 35 via a resistor R9. The filter section 23 is constituted by a further operational amplifier 37 whose input is derived from across a capacitor C11 connected to the output of the differential amplifier 21 via a parallel combination of eight resistors R13 to R27 selected by a sequence timer 39. In response to the disappearance of an output from the optical isolator 15, 17 the sequence timer 39, by means of switches S1 to S13, disconnects in turn each of the resistors R15 to R27 in parallel with the resistor R13, thereby increasing the resistance in series with capacitor C11 in steps and correspondingly reducing the cut-off frequency of filter section 23 and increasing the bandwidth of filter 7.

The above-mentioned desired step change in mode of filter 7 from NBW to WBW is thus achieved. Typically expansion from the NBW mode bandwidth to a bandwidth of 0.8 Hz to 2 kHz between −3 db points is done in 6 steps taking a total time of 64 milliseconds with 20% third harmonic present without causing significant offset transients. Expansion to full WBW mode bandwidth typically takes a few seconds longer, this relatively long time being required because, as the cut-off frequency of filter section 23 is reduced, and hence its time constant is increased, it becomes increasingly difficult for the voltage across capacitor C11 to follow the voltage across capacitor C3 as the charge on capacitor C3 decays. In the event of pollution discharge of capacitor C1, the change of voltage across capacitor C3 can be fairly rapid and it is therefore desirable to allow the voltage on capacitor C3 to decay appreciably before the filter 7 attains its full WBW mode bandwidth.

In response to the appearance of an output from isolator 15, 17 the sequence timer 39 immediately closes all the switches S1 to S13 simultaneously, thereby substantially instantaneously operating the filter 7 into its NBW mode from its WBW mode.

The output of the operational amplifier 37 is supplied via a resistor R29 to the differential amplifier 25 which is constituted by an operational amplifier 41 and a feedback resistor R31. An input from buffer amplifier 5 is supplied to amplifier 41 via a resistor R33.

The circuits LLD and LPT may be of any convenient conventional form.

Figure 5:
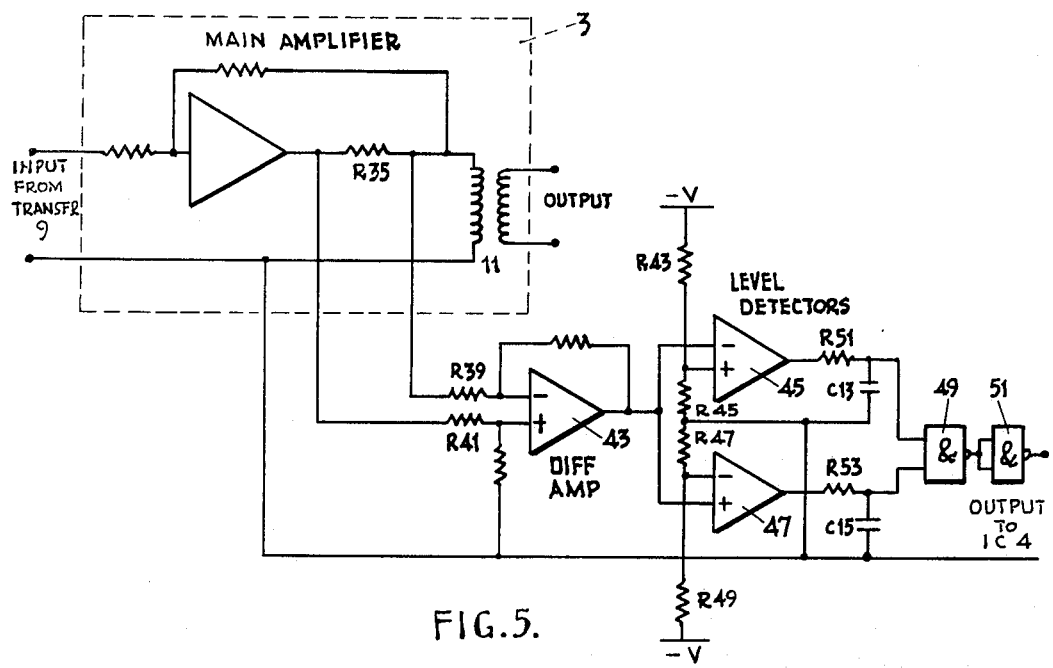
FIG. 5 is a circuit diagram of a part of the detector of FIG. 3.

One practical embodiment of the circuit SD is shown in FIG. 5. In this embodiment the value of the primary current in the main amplifier output transformer 11 is compared with a predetermined maximum possible value due to the burden presented by the response means. If the predetermined maximum value is exceeded, this indicates that the transformer core has saturated.

The input to the circuit SD is derived from across a resistor R35 connected in series with the primary of transformer 11. The main amplifier incorporates a resistor R37 provides feedback and the resistor R35 is connected inside the feedback loop so as to avoid regulation errors. The voltage across resistor R35 is applied via equal valued resistors R39 and R41 to the input of a differential amplifier 43 which rejects the common mode voltage of the main amplifier 3 and produces at its output a voltage analogue of the primary current of transformer 11.

Two level detectors 45 and 47 compare the positive and negative peak values of this analogue voltage against two reference levels equally disposed about zero and derived from a potential divider comprising resistors R43, R45, R47 and R49 connected across a suitable voltage source (not shown). The level detectors 45 and 47 are arranged so that their outputs are both logic '1' if their input voltage waveform is wholly within the band defined by the two reference levels, but if the waveform passes outside this band, then one or the other of the level detectors gives a '0' output. A NAND gate 49 combines the outputs of the detectors 45 and 47 so that core saturation on either a positive or negative half cycle of the voltage across resistor R35 results in '1' output from the gate 49, and this output is inverted by a further NAND gate 51 for application to gate IC4 in the logic circuit of detector 13. RC delay circuits comprising resistor R51 and capacitor C13 between level detector 45 and gate 49 and comprising resistor R53 and capacitor C15 between level detector 47 and gate 49 provide short delays so that the circuit SD does not respond to fast transient crossings of the reference levels such as may be caused by interference pick-up.

We claim:

1. An apparatus for monitoring high alternating voltages comprising: a capacitor potential divider for connection across a voltage to be monitored; a response means connected across a section of the divider; filter means between said section of the divider and the response means, said filter means having a first mode in which it exhibits a relatively wide band pass characteristic and a second mode in which it exhibits a relatively narrow band pass characteristic, said filter means including means enabling it to be changed from its second to its first mode with a given d.c. voltage at its input without producing an appreciable change in d.c. voltage at its output, and control means for causing said filter means to operate temporarily in its second mode to reduce the effect on said response means of a voltage step across said section of the divider.

2. An apparatus according to claim 1 wherein said filter means comprises a first section which defines said narrow band pass characteristic and a second section having a low pass characteristic whose cut-off frequency is changeable between a first and second values one below the lower cut-off frequency of said first section and the other above the upper cut-off of said first section, and circuit means interconnecting the first and second sections so that the output of the filter means is the input of the filter means less those components of the input of the filter means not passable by the first section which are passable by the second section so that when the cut-off frequency of the second section has its higher value the filter means has a pass band the same as the pass band of said first section, and when the cut-off frequency has its lower value the filter means has a wider pass band whose lower cut-off frequency is the cut-off frequency of said second section.

3. An apparatus according to claim 2 wherein said circuit means comprises: first differencing means having first and second inputs respectively connected to the input of the filter means and the output of said first section and having an output connected to the input of said second section; and second differencing means having first and second inputs respectively connected to the input of the filter means and the output of said second section and whose output constitutes the output of the filter means.

4. An apparatus according to claim 1 wherein the filter means includes means for progressively changing the cut-off frequency of said second section from its higher value to its lower value under control of said control means.

5. An apparatus according to claim 1 wherein said control means comprises means for initiating operation of said filter means in its second mode in response to the detection of trapped charge on said section of the divider, and for maintaining said filter means in its second mode until either, with the voltage being monitored present there is no significant component at the output of the filter due to said trapped charge, or said trapped charge has substantially leaked away.

6. An apparatus according to claim 5 wherein the output of the filter means is applied to said response means by way of a transformer having a magnetic core and the presence of trapped charge on said section of the capacitor divider is indicated by the occurrence of magnetic saturation in said magnetic core.

7. An apparatus according to claim 5 wherein said control means includes first means to produce an output indicative as to whether the voltage to be monitored is present or absent, second means to produce an output indicative as to whether a charge is trapped on said section of the divider, and third means to produce an output indicative as to whether a sufficiently great period has elapsed since the voltage to be monitored became absent for said trapped charge to have substantially leaked away; and logic means responsive to the outputs of said first, second and third means to operate said filter into its second mode in response to the presence of trapped charge and to maintain said filter means in its second mode either until at least said period has elapsed since the voltage to be monitored became absent, or until at least a period sufficient for any said significant component to die away has elapsed since the voltage to be monitored became present again after having been absent, whichever period elapses first.

* * * * *